United States Patent [19]

Duncan et al.

[11] Patent Number: 4,828,808
[45] Date of Patent: May 9, 1989

[54] APPARATUS FOR SILICON WEB GROWTH OF HIGHER OUTPUT AND IMPROVED GROWTH STABILITY

[75] Inventors: Charles S. Duncan, Penn Hills; Paul A. Piotrowski, Monroeville, both of Pa.

[73] Assignee: The United States of America as represented by the United States Department of Energy, Washington, D.C.

[21] Appl. No.: 92,796

[22] Filed: Sep. 2, 1987

[51] Int. Cl.$^4$ ............................................. C30B 27/02
[52] U.S. Cl. .................................................... 422/249
[58] Field of Search .......................... 422/249, 246; 156/DIG. 84, DIG. 83, 608, 617 M, 617 SP; 160/44; 49/1; 373/156, 157, 163; 126/220; 220/200; 252/62.3 R

[56] References Cited

U.S. PATENT DOCUMENTS 3,162,507 12/1964 Dematis et al. ................. 252/62.3 R
4,389,377 6/1983 Duncan et al. ...................... 422/246

OTHER PUBLICATIONS

Seidensticker and Hopkins, "Silicon Ribbon Growth by the Dendritic Web Process", Journal of Crystal Growth 50 (1980) 221-235.
Barrett, Meyers, Hamilton and Bennett, "Growth of Wide, Flat Crystals of Silicon Web", Journal of the Electrotechnical Society (1971), 952-57.
Seidensticker, "Dendritic Web Growth of Silicon", Crystals 8, 146-172 (1982).

Primary Examiner—Robert L. Stoll
Assistant Examiner—R. Bruce Breneman

[57] ABSTRACT

This disclosure describes an apparatus to improve the web growth attainable from prior web growth configurations. This apparatus modifies the heat loss at the growth interface in a manner that minimizes thickness variations across the web, especially regions of the web adjacent to the two bounding dendrites. In the unmodified configuration, thinned regions of web, adjacent to the dendrites, were found to be the origin of crystal degradation which ultimately led to termination of the web growth. According to the present invention, thinning adjacent to the dendrites is reduced and the incidence of crystal degradation is similarly reduced.

5 Claims, 7 Drawing Sheets

FIG. 11a  SECTION A-A

APPARATUS FOR SILICON WEB GROWTH OF HIGHER OUTPUT AND IMPROVED GROWTH STABILITY

The subject matter of the present invention was performed under a contract from the United States Federal Government, Government Contract Number JPL957207, and the Government has certain rights in this invention.

FIELD OF THE INVENTION

The present invention relates to an apparatus used for growing silicon dendritic web crystals, and to crystals grown thereby.

BACKGROUND OF THE INVENTION

Silicon dendritic web crystals are long, thin ribbons of single crystalline material of high structural quality which are grown in the (111) orientation. The current impetus for developing silicon dendritic-web is its application to the production of low-cost, highly efficient solar cells for direct conversion of sunlight to electrical energy. The thin ribbon form of the crystal requires little additional processing prior to device fabrication, in contrast to wafer substrates from the more traditional Czochralski crystal which must be sliced, lapped and polished prior to use, a costly process even though large volume economies are practiced. Additionally, the rectangular shape of the silicon ribbon leads to efficient packing of individual cells into large modules and arrays of solar cells.

An important aspect of successful dendritic web crystal growth is the configuration of the shields and the lid used to cover the hot silicon melt. In the past, lids having a so-called "dog-bone" slot have been used with some success. Such lids also typically include a pair of outboard holes spaced a predetermined distance from the ends of the slot. These outboard holes assist in maintaining the growing dendritic web crystal at a constant width. Also included in conventional lid configurations are a pair of holes at one end of the lid. These holes are used as entry and exit holes for a laser beam used as a detector, which measures the level of the silicon melt. Another feature typically used in lid configurations is a hole through which silicon pellets are dropped for melt replenishment. Such holes are typically located at the end of the lid opposite from the laser beam holes.

Conventional lid configurations for web growth have produced a maximum of approximately 40,000 square centimeters per week per furnace. A negative characteristic of web grown from a conventional configuration is a pronounced thinning of the web immediately adjacent to each dendrite. The output of this configuration is further limited by crystalline degradation which originates in the thinned areas. The result is often termination of the crystals, thus limiting output, since termination of growth requires nonproductive and less-productive time to restart and widen web crystals.

Another problem associated with conventional lid designs is that the laser beam holes and the replenishment hole are asymmetrical with respect to each other, and thus upset somewhat the delicate thermal balance sought to be achieved by creating lids with symmetrical geometries.

SUMMARY OF THE INVENTION

In an effort to reduce or eliminate one or more of these problems a new lid configuration was devised. The new lid includes a slot through which the dendritic web crystals are pulled, width-limiting outboard holes spaced a predetermined distance from the ends of the slot, and enlarged end openings at the ends of the slot for dissipating the heat of fusion from the growing web such that the resulting web has a substantially uniform thickness. In one embodiment of the invention, the slot has a "bow-tie" configuration, in which the ends of the slot are enlarged, with the enlarged ends having a wider and narrower end, the narrower end connecting with the slot, the wider end facing the adjacent outboard hole.

In another embodiment of the invention, the "bow-tie" slot is retained, and one or more of the outboard holes are shaped in the form of a "T" in order to eliminate the need for laser beam holes and permit the addition of another melt replenishment hole, thereby creating geometric symmetry in the lid configuration. In this embodiment, the "T" slot is angle cut in the lid, to enable the laser beam used for melt level detection to enter and exit through the lid. Each "T" slot replaces an outboard hole, and is the same size as the outboard hole it replaces, to maintain the thermal balance of the system.

Other details, objects and advantages of the invention will become apparent as the following description of the presently preferred embodiments and presently preferred methods of practicing the invention proceeds.

BRIEF DESCRIPTION OF THE DRAWINGS

In the accompanying drawings, the preferred embodiments of the invention and preferred methods of practicing the invention are illustrated in which:

FIG. 11a is a cross sectional view of the embodiment of the present invention of FIG. 11 taken through section A—A of FIG. 11.

DETAILED DESCRIPTION OF THE INVENTION

Figure 1:
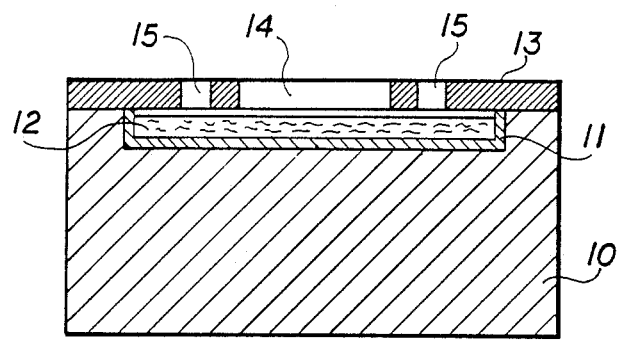
FIG. 1 is a cross sectional view showing a conventional arrangement used for growing silicon dendritic web crystals.

FIG. 1 shows a conventional arrangement for growing silicon dendritic web crystals. A susceptor 10 contains a crucible 11, which holds molten polycrystalline silicon 12. A susceptor lid 13 rests on top of the susceptor 10. The lid 13 has a slot 14, through which the growing web is pulled, and a pair of outboard holes 15, which control the width of the growing web. Typically, a series of heat shields (not shown) is positioned above the lid 13.

Figure 2:
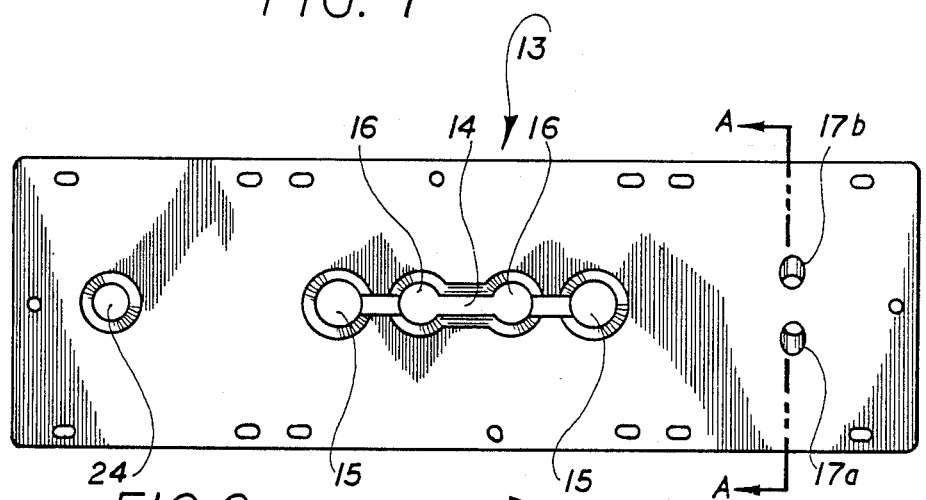
FIG. 2 is a plan view showing a conventional lid configuration used for growing silicon dendritic web crystals.
Figure 3:
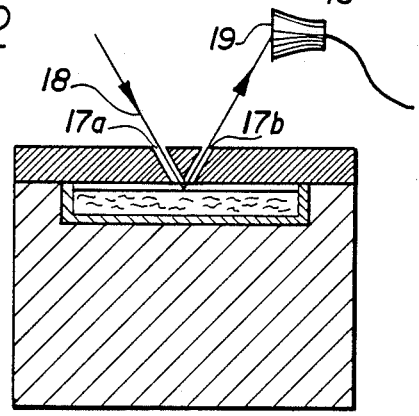
FIG. 3 is a cross sectional view of a conventional arrangement for growing silicon dendritic web crystals, taken along lines A—A of FIG. 2.

FIG. 2 illustrates a conventional susceptor lid configuration. The lid 13 has a "dog-bone" slot 14 and outboard holes 15. The ends 16 of the slot 14 are rounded to accommodate the dendrites (not shown) used for growing silicon dendritic web crystal. The lid 13 also typically has a pair of angled laser beam holes 17. As shown in FIG. 3, the laser beam holes 17 are angled to permit a laser beam 18 to enter one laser beam hole 17a, strike the silicon melt surface, and be reflected out through the opposite laser beam hole 17b onto a detector 19, which uses the angle of the reflected beam to measure the level of the silicon melt. When the detector indicates that the silicon melt level is below a predetermined level, silicon pellets are dropped automatically into the melt to replenish the depleted silicon. A melt replenishment hole 24 is typically used for this purpose.

Figure 4:
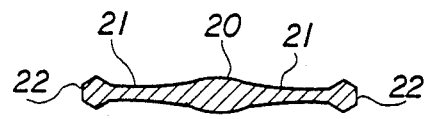
FIG. 4 is a schematic cross sectional view of a silicon dendritic web crystal grown through a conventional lid, showing the thinned regions of the web near the dendrites.

One problem with the conventional lid shown in FIG. 2 is its tendency to grow crystals having thinned web regions near the dendrites. FIG. 4 illustrates a cross sectional view of a silicon dendritic web grown from a lid such as that shown in FIG. 2. As shown, the web 20 exhibits narrowed regions 21 near the dendrites 22. Such narrowed regions can and do lead to loss of the dendritic web's twin plane crystalline structure, which in turn leads to deformation in growth and eventually a break or other interruption in crystal growth. It is believed that the thinned region results from uneven dissipation of the latent heat of fusion in the area of the bounding dendrites 22.

Figure 5:
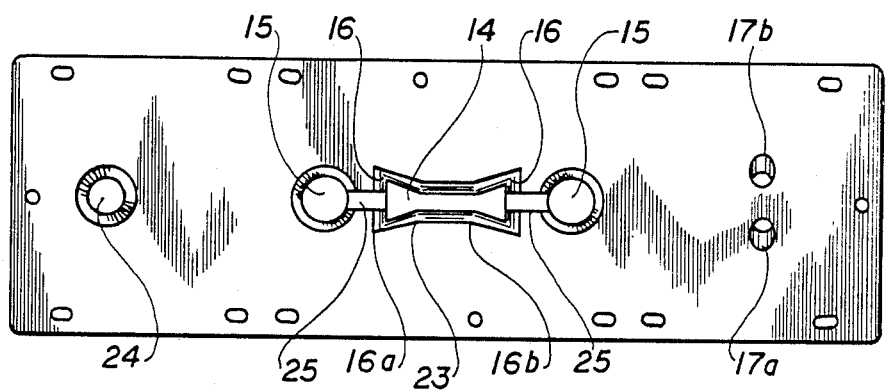
FIG. 5 is a plan view of an improved lid configuration according to one embodiment of the present invention.

In order to solve this thinning problem, a new lid configuration as shown in FIG. 5 was devised. The new lid continues to have a slot 14 and outboard holes 15. The outboard holes 15 are spaced a predetermined distance from the ends 16 of the slot 14. The ends 16 of the slot 14 are enlarged, having a wider end 16a and a narrower end 16b, such that the slot appears as a "bow tie" configuration rather than a "dog bone" configuration. The wider end 16a defines the outside portion of the slot end 16. As shown in FIG. 5 the slot ends 16 are tapered to the point 23 where the slot ends 16 meet the slot 14. The ends 16 of the slot 14 may be connected to the outboard holes with a connecting slot 25 as shown.

Figure 6:
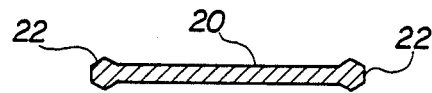
FIG. 6 is a schematic cross sectional view of a silicon dendritic web crystal grown through an improved lid according to the present invention.

FIG. 6 shows a cross section of a dendritic web crystal grown using the lid shown in FIG. 5. As shown, the web 20 has a uniform thickness between the bounding dendrites 22. Using the lid configuration of FIG. 5, the longest single dendritic web crystal ever grown, over 17 meters long, was produced. The enlarged, tapered slot ends 16 of the lid shown in FIG. 5 increase the heat loss from the web growth liquid-to-solid interface in the thinned and immediately adjacent regions of the growing web. Through added heat loss in those regions, the thickness of web grown is increased in those regions. Thus, the enlarged ends 16 permit nearly uniform dissipation of the latent heat from all regions of the web, such that web of uniform thickness results.

Growth Results of the New Configuration

Figure 7:
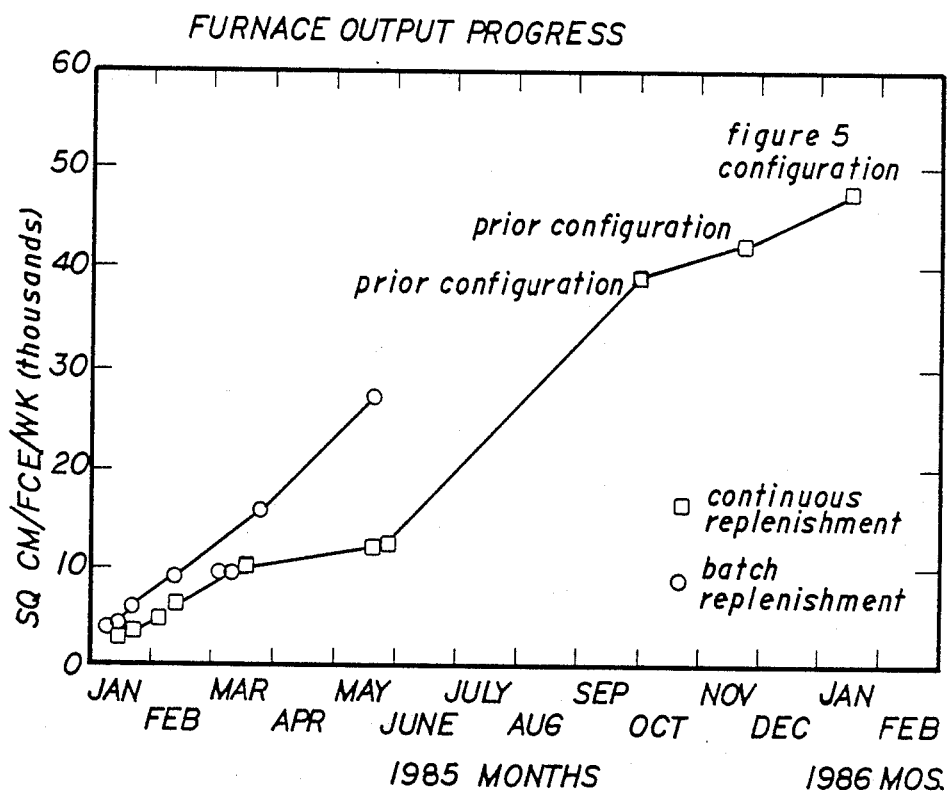
FIG. 7 is a graph showing the improved crystal output made possible by using one embodiment of the present invention, relative to prior lid configurations.

The new configuration shown in FIG. 5 has been successful in diminishing the thinning observed with the FIG. 2 configuration as represented in FIG. 4, and growth was easily achieved and maintained. Using the lid configuration of the present invention, the resulting web growth achieved the following major improvements as compared to the performance of the FIG. 2 configuration:

1. The output per week (7 days, 24 hours/day) was 47,000 cm$^2$, a new record (as compared to 40,000–42,000 cm$^2$ with the prior configurations), as shown in FIG. 7.

2. By extending the growth period to one week plus 15 hours, an output of 50,000 cm$^2$ was obtained. This also is a new record.

Figure 8:
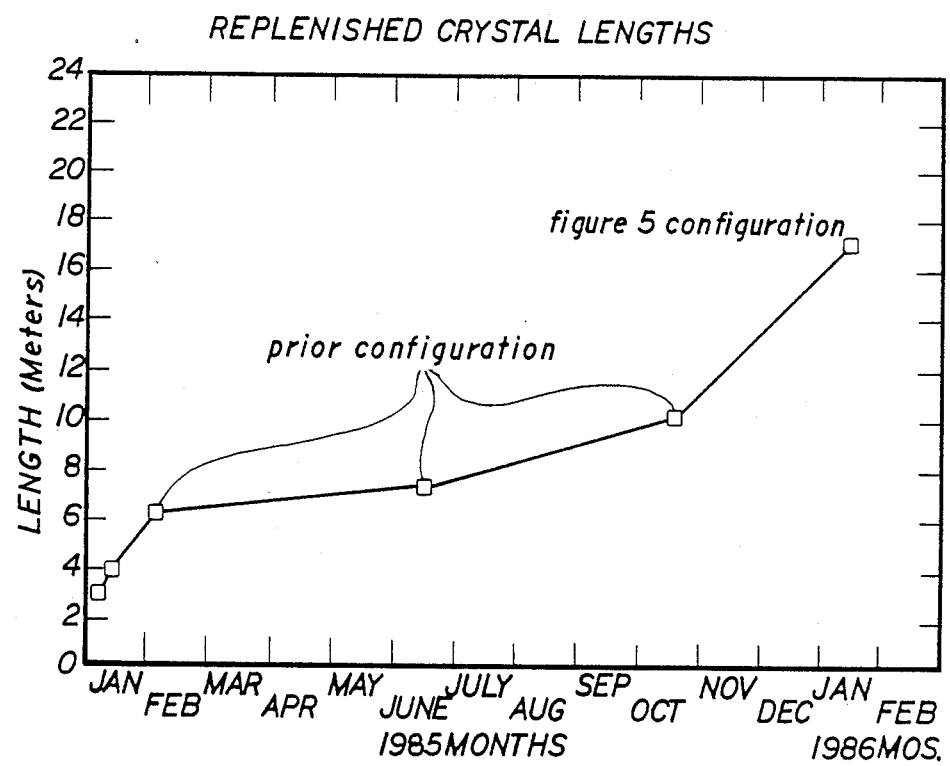
FIG. 8 is a graph showing the improved crystal lengths made possible by using one embodiment of the present invention, relative to prior lid configurations.

3. Included in the record run, a fully melt replenished crystal of 17 meters length was grown as shown in FIG. 8. Again, this was a new record.

4. The number of terminations per week of web growth was greatly reduced while producing the record output. For comparable output, the FIG. 5 configuration produced 31 web crystals (and thus fewer breaks) compared to 51 crystals (and thus more breaks) for the FIG. 2 configuration.

Figure 9:
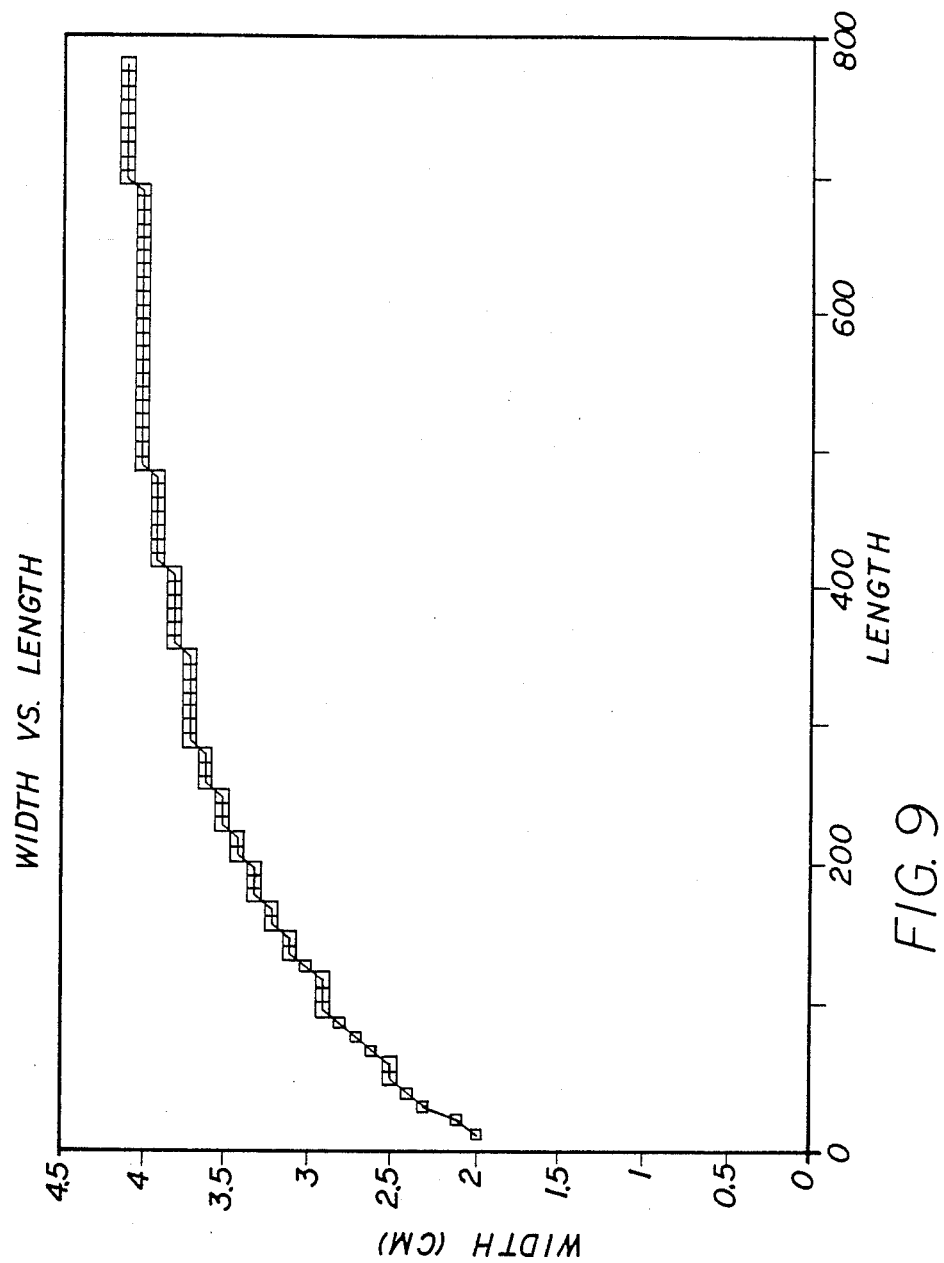
FIG. 9 is a graph showing the length at which a crystal grown using one embodiment of the present invention achieves a constant width of 4 cm.
Figure 10:
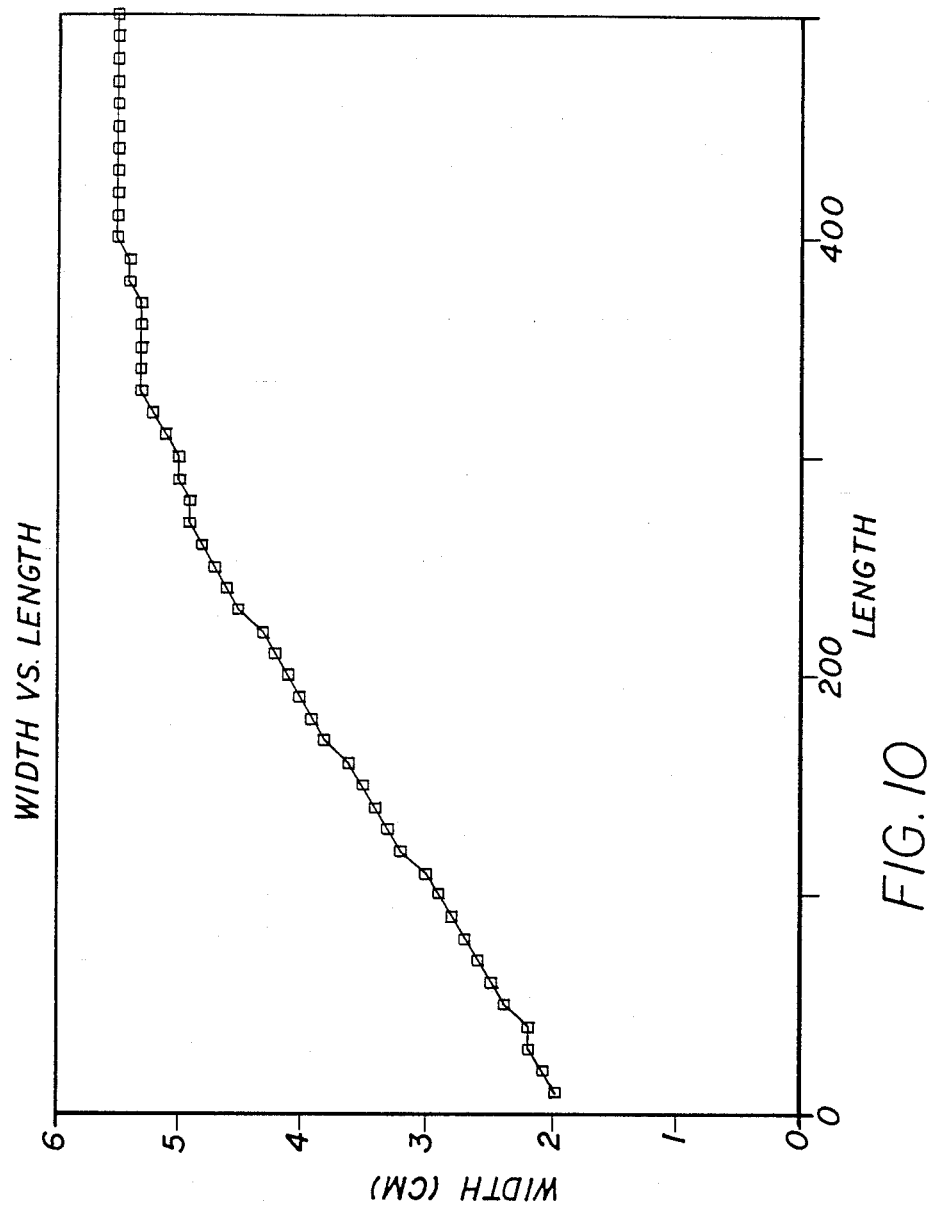
FIG. 10 is a graph showing the length at which a crystal grown using one embodiment of the present invention achieves a constant width of 5.5 cm.

The FIG. 5 configuration was found to widen and control at a width of approximately 4 centimeters as shown in FIG. 9. A wider version of this configuration has been fabricated and web has been grown. The wider version has been found to grow at a controlled width of about 5.5 centimeters as shown in FIG. 10.

Figure 11:
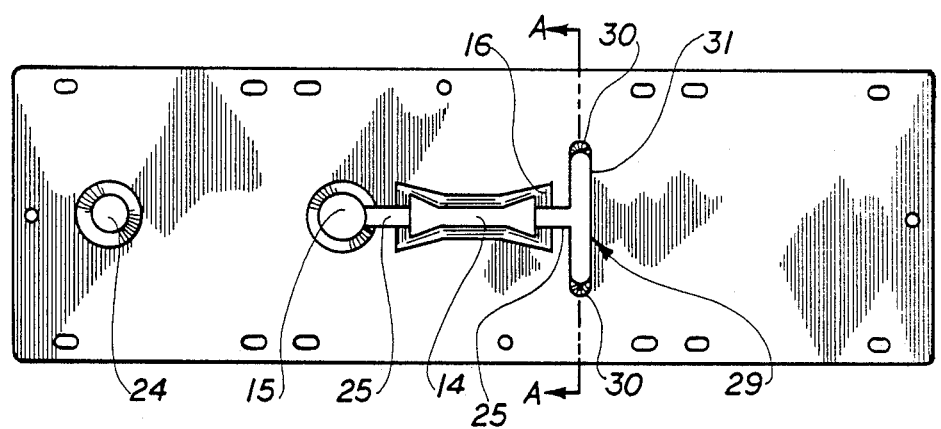
FIG. 11 is a plan view of another embodiment of the present invention.

Yet another preferred embodiment of the present invention is shown in FIG. 11. Referring again to FIG. 2, previous lid designs have required separate regions of the melt and lid areas to provide the requirement for width control and melt level sensing. In FIG. 2, for example, the melt is replenished through a melt replenishment hole 24 in the lid 13. Melt level sensing is accomplished with two angled holes 17a and 17b, which allow a laser beam detector to sense melt level. Width control is achieved by the outboard holes 15. The lid shown in FIG. 11 combines the outboard hole and laser beam holes into a single multipurpose region. The space gained from such a combined use can be used for growth of wider crystals and melt replenishment. For a typical configuration the additional melt length made available is 2.24 inches in a melt of 10 inches overall length. Thus the increase in usable lid space is 22.4%.

The lid configuration of FIG. 11 increases the available area which can be used for melt replenishment and web growth. This configuration was achieved by combining functions of the right outboard hole required for width control and the laser beam route holes required for melt level control into a single opening which serves both requirements. Thus the area to the right of the slot 14 in FIG. 2, which was used for melt level sensing and control is no longer required for that purpose and that area is consequently available for added melt replenishment and growth width.

In the FIG. 11 configuration, the dual purpose opening 29, which may be referred to conveniently as a "T-slot," replaced the right outboard hole 15 and the laser beam holes 17 of the FIG. 5 embodiment. As shown, the "T-slot" 29 includes a connecting slot 25 and an elongated portion 31. The connecting slot 25 connects the elongated portion 31 to the slot end 16. The dimensional design provides a beam route identical to that provided by the original beam route holes of FIG. 5 and will satisfy the purpose of those holes. FIG. 11a illustrates a sectional view taken along the lines A—A of FIG. 11. As shown, the ends 30 of the "T" slot are angled to permit the entry and exit of the laser beam 18 used for melt level detection.

Figure 12:
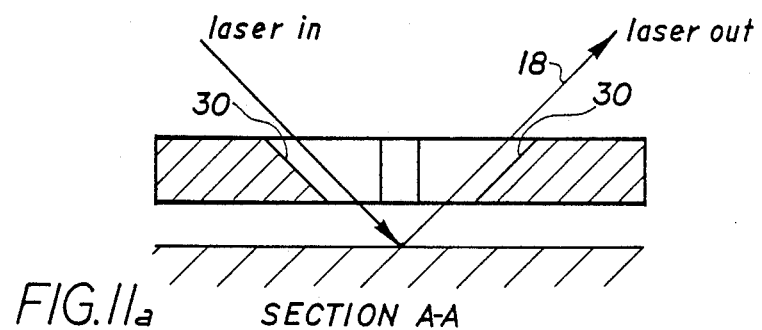
FIG. 12 is a plan view of another embodiment of the present invention.
Figure 12:
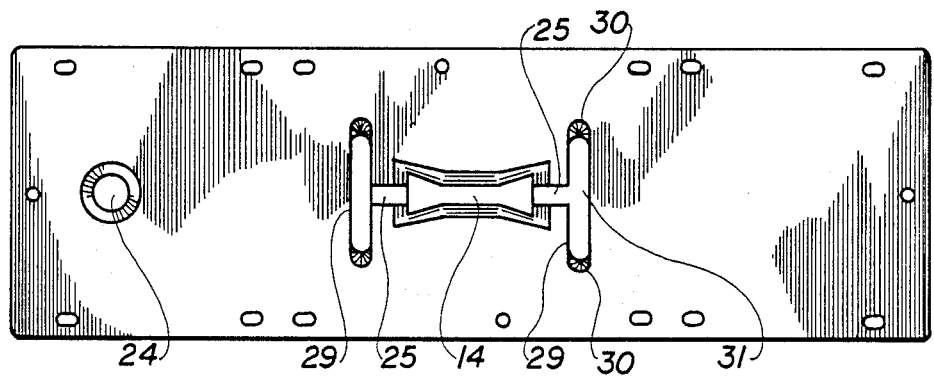

FIG. 12 illustrates a lid configuration in which both outboard holes 15 of the FIG. 5 configuration are replaced by T-slots 29. A melt replenishment hole 24 is retained, but as seen in the Figure, the laser beam holes have been removed.

The T-slot opening was further designed to have an essentially identical heat loss effect as would otherwise be provided by the customary outboard hole required for width control. This was accomplished by designing the elongated portion 31 of the "T-slot," that is, that portion perpendicular to the lengthwise direction of the slot 14, to be of equal area to the former outboard hole 15 of FIGS. 2 and 5.

Actual web growth with the lid and shield system of FIGS. 11 and 12 produced web growth essentially unchanged from the growth experience obtained with the configuration of FIG. 5. This result therefore verified that the thermal function of the T-slot was virtually identical to the prior outboard hole.

To make use of the FIG. 11 and 12 configurations, the added lid and melt area made available by application of the T-slot may be configured in a manner which provides added melt replenishment and/or web growth width capability. A preferred utilization of this space is to use it for a second region of melt replenishment, thereby doubling the melt replenishment capability of the system and creating geometric symmetry. By addition of melt replenishment holes on the right side of FIGS. 11 and 12 this doubling can be accomplished. In actual practice, however, this use would add more melt replenishment capacity than needed and a more practical use would be to lengthen the growth slot and provide two melt replenishment regions of reduced, but adequate, capacity. This configuration would provide added growth width capacity and a matching increase in melt replenishment rate capacity.

An alternative application of this invention is an asymmetric growth configuration which includes melt replenishment at one end and a growth region over the remaining melt length. This approach has the advantage that only a single melt replenishment pellet feeder would be required.

Although the invention has been described in detail in the foregoing for the purpose of illustration, it is to be understood that such detail is solely for that purpose and that variations can be made therein by those skilled in the art without departing from the spirit and scope of the invention except as it may be limited by the claims.

We claim:

1. A lid for use in conjunction with an apparatus for growing silicon dendritic web crystals, said lid including a bow-tie shaped slot through which said crystals may be pulled, said slot having two ends and at least one outboard opening spaced from each said end of said slot, so as to effect width control of crystals grown through said slot, said slot including an enlarged end opening at each said end of said slot, said enlarged end openings allowing heat of fusion to be dissipated substantially evenly from said growing web, such that said web has a substantially uniform thickness, said enlarged end openings each having a wider end and a narrower end, the wider end defining an outside portion of said enlarged end opening, and said wider end tapers to meet said narrower end of each said enlarged end opening.

2. A lid for use in conjunction with an apparatus for growing silicon dendritic web crystals, said lid including a bow-tie shaped slot through which said crystals may be pulled, said slot also having a length and two ends having a width, said slot having enlarged end openings, each having a wider end and a narrower end, the wider end defining an outside portion of each enlarged end opening, and said wider end tapers to meet said narrower end of each enlarged end opening, one elongated opening has a length and a width, said length being greater than said width of said at least one elongated outboard opening said at least one elongated outboard opening being located adjacent said slot such that a line passing longitudinally axially through said slot is perpendicular to a line passing longitudinally axially through said at least one elongated outboard opening, said elongated outboard opening being adapted so as to enable a laser beam melt level detector to be used in connection with said elongated outboard opening.

3. The lid of claim 2 wherein said elongated outboard opening and said slot are connected by a connecting opening.

4. The lid of claim 2 wherein said elongated outboard opening has angled ends, enabling a laser beam melt level detector to be used in connection with said outboard opening.

5. The lid of claim 1 wherein said enlarged end openings have a substantially triangular shape, said triangular shape having a wider end forming a base of said triangular shape, and said narrower end forming an apex of said triangular shape, said apex joining each said enlarged end opening to one end of said slot.

* * * * *